(12) United States Patent  
Yoon et al.

(10) Patent No.: US 7,875,874 B2
(45) Date of Patent: Jan. 25, 2011

(54) SEMICONDUCTOR LIGHT EMITTING DEVICE AND METHOD OF MANUFACTURING THE SAME

(75) Inventors: Ho Sang Yoon, Gwangju (KR); Sang Kyun Shim, Jeonju-si (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/669,026

(22) PCT Filed: Jul. 25, 2008

(86) PCT No.: PCT/KR2008/004359

§ 371 (c)(1),
(2), (4) Date: Jan. 13, 2010

(87) PCT Pub. No.: WO2009/017338

PCT Pub. Date: Feb. 5, 2009

(65) Prior Publication Data

US 2010/0187495 A1    Jul. 29, 2010

(30) Foreign Application Priority Data

Jul. 27, 2007    (KR) ...................... 10-2007-0075908

(51) Int. Cl.
*H01L 29/06* (2006.01)
(52) U.S. Cl. ............................. 257/13; 257/14; 257/98; 257/103; 257/E33.005; 257/E33.008; 257/E33.023; 438/47
(58) Field of Classification Search .................. 257/13, 257/14, 98, 103, E33.005, E33.008, E33.023; 438/47
See application file for complete search history.

(56) References Cited

U.S. PATENT DOCUMENTS

| 4,843,031 | A | 6/1989 | Ban et al. |
| 4,904,337 | A | 2/1990 | Elliott et al. |
| 5,581,116 | A | 12/1996 | Nakatsu |

(Continued)

FOREIGN PATENT DOCUMENTS

EP    0 637 086 A2    2/1995

(Continued)

OTHER PUBLICATIONS

Kikawa, Junjiroh et al. "Electroluminescence studies under forward and reverse bias conditions of a nitride-rich $GaN_{1-x}P_x$ SQW structure LED grown by a laser-assisted metal-organic chemical vapor deposition", Solid-State Electronics vol. 47, pp. 523-527 (2003). www.elsevier.com/locate/sse.

(Continued)

*Primary Examiner*—Andy Huynh
(74) *Attorney, Agent, or Firm*—Birch, Stewart, Kolasch & Birch, LLP (57) ABSTRACT

A semiconductor light emitting device and a method of manufacturing the same are provided. The semiconductor light emitting device comprises a first semiconductor layer emitting electrons, a second semiconductor layer emitting holes, and an active layer emitting light by combination of the electrons and holes. At least one of the layers comprises an photo enhanced minority carriers.

14 Claims, 9 Drawing Sheets

U.S. PATENT DOCUMENTS

| | | | |
|---|---|---|---|
| 5,909,051 A | 6/1999 | Stockman et al. | |
| 6,015,979 A | 1/2000 | Sugiura et al. | |
| 6,266,355 B1 * | 7/2001 | Sverdlov | 372/45.01 |
| 6,665,329 B1 * | 12/2003 | Crawford et al. | 372/75 |
| 2005/0224825 A1 | 10/2005 | Ishizaki | |
| 2006/0071226 A1 * | 4/2006 | Kojima et al. | 257/98 |

FOREIGN PATENT DOCUMENTS

| | | |
|---|---|---|
| EP | 1 071 143 A1 | 1/2001 |
| EP | 1 391 941 A1 | 2/2004 |
| JP | 5-235408 A | 9/1993 |
| JP | 8-255927 A | 10/1996 |
| JP | 10-242061 A | 11/1998 |
| JP | 2005-150627 A | 6/2005 |

OTHER PUBLICATIONS

Miyachi et al., "The Activation of Mg in GaN by annealing with minority-carrier injection", Applied Physics Letters, AIP, American Institute of Physics, vol. 72, No. 9, pp. 1101-1103, XP012020817 (Mar. 2, 1998).

* cited by examiner

SEMICONDUCTOR LIGHT EMITTING DEVICE AND METHOD OF MANUFACTURING THE SAME

TECHNICAL FIELD

Embodiments relate to a semiconductor light emitting device and a method of manufacturing the same.

BACKGROUND ART

A group III-V nitride semiconductor is being spotlighted as a gist material of a light emitting device such as a light emitting diode (LED) or a laser diode (LD) due to its physical and chemical properties.

The group III-V nitride semiconductors are being widely used for light emitting devices that emit light having a blue or green wavelength band and applied as light sources of a variety of products such as high-speed switching devices such as metal semiconductor field effect transistors (MESFET) and hetero junction field effective transistors (HEMT), high-output devices, keypad light emitting units of mobile phones, electronic scoreboards, and lightings.

DISCLOSURE OF INVENTION

Technical Problem

Embodiments provide a semiconductor light emitting device that can generate a minority carriers in at least one semiconductor layer using a lighting source and a method of manufacturing the semiconductor light emitting device.

Embodiments provide a semiconductor light emitting device that can expose an undoped semiconductor layer to light from a lighting source and a method of manufacturing the semiconductor light emitting device.

Embodiments provides a semiconductor light emitting device that can expose an InGaN layer comprising a low mol indium between a first conductive semiconductor layer and an active layer to light from a lighting source and a method of manufacturing the semiconductor light emitting device.

Embodiments provide a semiconductor light emitting device that can generate a minority holes by exposing a quantum well layer of an active layer to light from a lighting source and a method of manufacturing the semiconductor light emitting device.

Embodiments provide a semiconductor light emitting device that can generate a minority electrons by exposing a second conductive semiconductor layer on an active layer to light from a lighting source.

Technical Solution

An embodiment provides a semiconductor light emitting device comprising: a semiconductor light emitting device comprising: a light emitting structure layer comprising a first semiconductor layer emitting electrons, a second semiconductor layer emitting holes and an active layer emitting light by combination of the electrons and holes, wherein at least one of the light emitting structure layer comprises an photo enhanced minority carriers.

An embodiment provides a semiconductor light emitting device comprising: a light emitting structure layer comprising a first semiconductor layer comprising at least one of a first undoped semiconductor layer, a first conductive semiconductor layer, and a low-mol InGaN layer; an active layer on the first semiconductor layer; and a second semiconductor layer on the active layer, wherein at least one of the light emitting structure layer comprises an photo enhanced minority carriers.

An embodiment provides a method of manufacturing a semiconductor light emitting device comprising: forming first semiconductor layer; forming an active layer on the first semiconductor layer; and forming a second semiconductor layer on the active layer, wherein at least one of the layers is grown through an exposure process.

Advantageous Effects

The embodiments can improve light emission efficiency of an active layer.

The embodiments can enhance electrical tolerance such as ESD and improve a diode electrical property such as an inverse current, an inverse voltage, and the light of a semiconductor light emitting device.

The embodiments can provide a first conductive semiconductor layer that has an excellent crystalline.

BEST MODE FOR CARRYING OUT THE INVENTION

Hereinafter, semiconductor light emitting devices and methods of manufacturing the same in accordance with embodiments will be described with reference to the accompanying drawings. In the following description, it will be understood that when a layer (or film) is referred to as being "on" another layer or substrate, it can be directly on the other layer or substrate, or intervening layers may also be present. Further, it will be understood that when a layer is referred to as being "under" another layer, it can be directly under the other layer, and one or more intervening layers may also be present. In addition, "on" and "under" of each layer will be referred based on the drawings. Further, the thickness of each layer is exemplarily illustrated and thus the actual thickness of each layer is not limited to the drawings.

FIGS. 1 to 4 illustrate a first embodiment.

Figure 1:
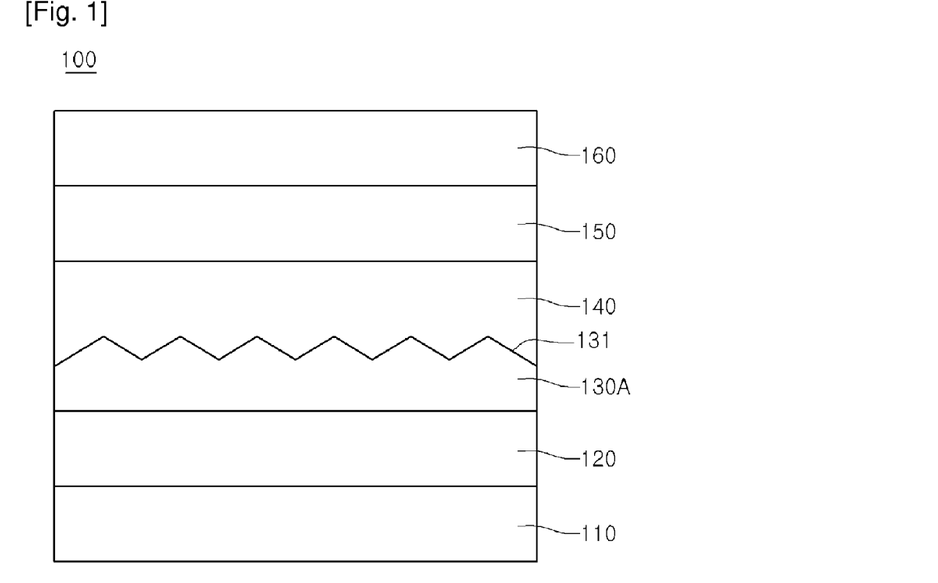
FIG. 1 is a side sectional view of a semiconductor light emitting device according to a first embodiment.
Figure 2:
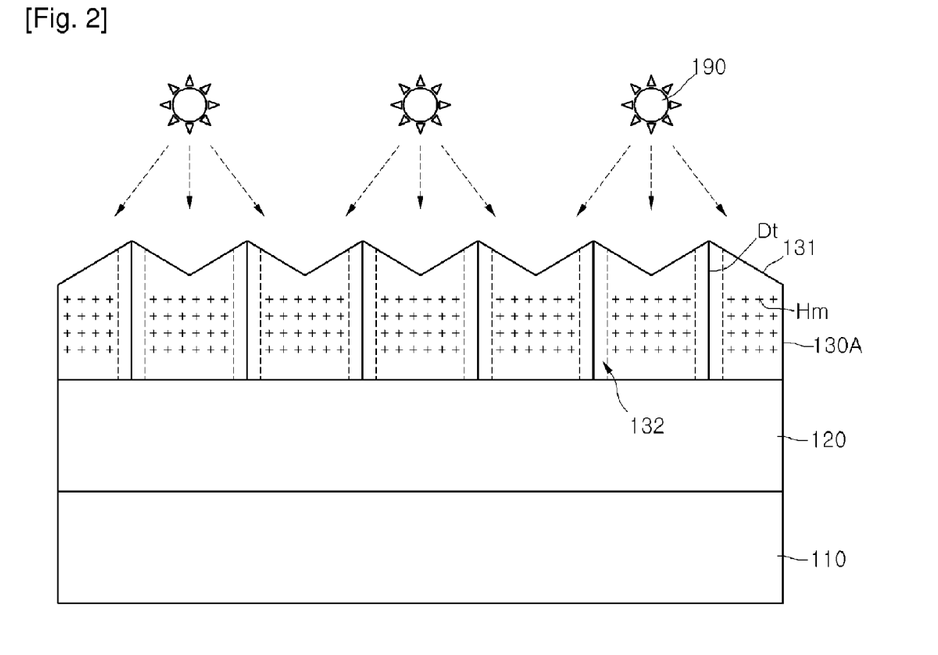
FIG. 2 is a view of a forming example of an undoped semiconductor layer of FIG. 1.

FIG. 1 is a side FIG. 1 is a side sectional view of a semiconductor light emitting device according to a first embodiment, and FIG. 2 is a view of a forming example of an undoped semiconductor layer of FIG. 1.

Referring to FIG. 1, a semiconductor light emitting device 100 comprises a substrate 110, a buffer layer 120, a first undoped semiconductor layer 130A, a first conductive semiconductor layer 140, an active layer 150, and a second conductive semiconductor layer 160.

The substrate 110 may be formed of at least one of $Al_2O_3$, GaN, SiC, ZnO, Si, GaP, InP, Ge, and GaAs. The substrate 110 may be a substrate having a conductive property. The surface of the substrate 110 may be provided with a pattern having protrusions and grooves. However, the substrate 110 is not limited thereto.

A nitride semiconductor is grown on the substrate 110. One of a physical vapor deposition (PVD) apparatus, a chemical vapor deposition (CVD) apparatus, a plasma laser deposition (PLD) apparatus, a dual-type thermal evaporator sputtering apparatus, a metal organic chemical vapor deposition apparatus may be used as a growing apparatus.

The buffer layer 120 is formed on the substrate 110. The buffer layer 120 may be formed of GaN, InN, AlN, AlInN, InGaN, AlGaN, InAlGaN, or the like. The buffer layer 120 attenuates lattice mismatch between GaN and a material of the substrate 110. Here, the buffer layer 120 may be not formed.

The first undoped semiconductor layer 130A is formed on the buffer layer 120. The first undoped semiconductor layer 130A may be an undoped GaN layer and functions as a substrate on which the nitride semiconductor is grown.

Referring to FIGS. 1 and 2, the first undoped semiconductor layer 130A is grown in-situ by an exposure process using lighting source 190 (for example, a lamp, hereinafter referred to as "lamp"). Here, the lamps 190 are form photo electro luminescence growing. For example, the lamp 190 may be selected from the group consisting of a mercury lamp, an X-ray lamp, an E-beam lamp, and a halogen lamp, and a combination thereof.

The first undoped semiconductor layer 130A is formed to have a predetermined thickness (e.g., 1-5 μm) by supplying $NH_3$ and TMGa at a growing temperature (e.g., 700-1500° C.). The first undoped semiconductor layer 130A is grown in-situ through an exposure process using the lamps 190.

As the first undoped semiconductor layer 130A is grown by the exposure process using the lamps 190, an photo enhanced minority holes (Hm) are generated in the crystal of the first undoped semiconductor layer 130A. Here, due to the mismatch between the substrate 110 and the GaN layer crystal, dislocations Dt having positive charges are generated in the first undoped semiconductor layer 130A. In addition, a region 132 where no the photo enhanced minority holes exists is formed around the dislocations Dt.

A chemical equation for generating the undoped GaN layer is as follows:

where, (g) means a gas-phase and (s) means a solid-phase.

By the chemical equation of the undoped GaN layer, peripheries of the dislocations Dt are normally grown at a normal growing rate of 2 μm/hr. Regions except for the peripheries of the dislocations Dt are grown at a relatively low growing rate lower than the normal growing rate by 10-15% since the generation of intermediate products such as holes (+) or electrons (−) that are generated by the above chemical equation is disturbed. By this growing rate difference, a surface of the first undoped GaN layer 130A is uneven having protrusions and grooves.

The first undoped semiconductor layer 130A may be formed such that a dead zone 132 where the dislocations are generated is thicker than a zone where no dislocation exists.

As the surface 131 of the first undoped semiconductor layer 130A is formed to be uneven, the dislocations having a bad effect on a LED structural property may be pinned and an area of the free surface increases.

Referring to FIGS. 1 and 2, the first conductive semiconductor layer 140 is formed on the first undoped semiconductor layer 130A. The first conductive semiconductor layer 140 may be an N-type semiconductor layer doped with N-type dopants. The N-type semiconductor layer may be formed of a compound semiconductor selected from the group consisting of GaN, InN, AlN, InGaN, AlGaN, InAlGaN, AlInN. The N-type dopants comprise at least one of Si, Ge, Sn, and Te. Since the first conductive semiconductor layer 140 is formed on the first undoped semiconductor layer 130A, the crystal defect may be reduced.

The active layer 150 is formed on the first conductive semiconductor layer 140. The active layer 150 may be formed in a single quantum well structure having an $In_xGa_{1-x}N$ well layer/GaN barrier layer or a cycle of the $In_xGa_{1-x}N$ well layer/$Al_yGa_{1-y}N$ barrier layer or a multi-quantum well structure. Here, the $In_xGa_{1-x}N$ well layer and $Al_yGa_{1-y}N$ barrier layer may be adjusted within a range of $0<x\leq1, 0<y\leq1$. The semiconductor material for the active layer 150 may be varied in accordance with a wavelength of the light emitted. That is, the semiconductor material for the active layer 150 is not specifically limited.

The second conductive semiconductor layer 160 is formed on the active layer 150. The second conductive semiconductor layer 160 may be a P-type semiconductor layer doped with P-type dopants. The P-type semiconductor layer may be formed of a compound semiconductor selected from the group consisting of GaN, InN, AlN, InGaN, AlGaN, InAlGaN, and AlInN. The P-type dopants comprise at least one of Mg, Zn, Ca, Sr, and Ba.

A third conductive semiconductor layer (not shown) may be formed on the second conductive semiconductor layer 160. Here, the third conductive semiconductor layer may be a N-type semiconductor layer. The semiconductor light emitting device 100 may be formed in one of an N-P junction structure, a P-N junction structure, an N-P-N junction structure, and a P-N-P junction structure. In addition, a structure comprising at least the first conductive semiconductor layer 140, the active layer 150, and the second conductive semiconductor layer 160 may be defined as a light emitting structure. The light emitting structure may comprise a semiconductor layer emitting electrons, a semiconductor layer emitting holes, and an active layer. Other layers may be further formed on or under the semiconductor layers. However, the light emitting structure is not limited to this configuration.

In the first embodiment, since the growing of the first undoped semiconductor layer 130A is formed by the exposure process using the lamps 190, the surface 131 of the first undoped semiconductor layer 130A may be formed to be uneven. Therefore, the crystal defect of the first conductive semiconductor layer 140 grown on the first undoped semiconductor layer 130A is reduced and thus the first conductive semiconductor layer 140 may have an excellent crystalline. Further, the light emitting efficiency of the active layer 150 can be improved and diode properties such as the inverse current, inverse voltage, and the like of the resulting LED structure can be improved. Furthermore, An electrical tolerance such as electrostatic discharge (ESD) can be enhanced.

In the embodiment, although the first undoped semiconductor layer 130A is grown in-situ through the exposure process using the lamps 190, the first conductive semiconductor layer 140 may be also grown in-situ through the exposure process using the lamps 190.

In addition, according to the first embodiment, at least one of the semiconductor layers 140, 150, and 160 on the first undoped semiconductor layer 130A may be grown in-situ through the exposure process using the lamps 190. At this point, the photo enhanced minority carriers such as electrons and holes are generated in the layer exposed to the light from the lamps 190 by the chemical reaction with materials injected during the growing process. Therefore, the light emitting efficiency and electrical tolerance of the active layer 150 can be enhanced.

Figure 3:
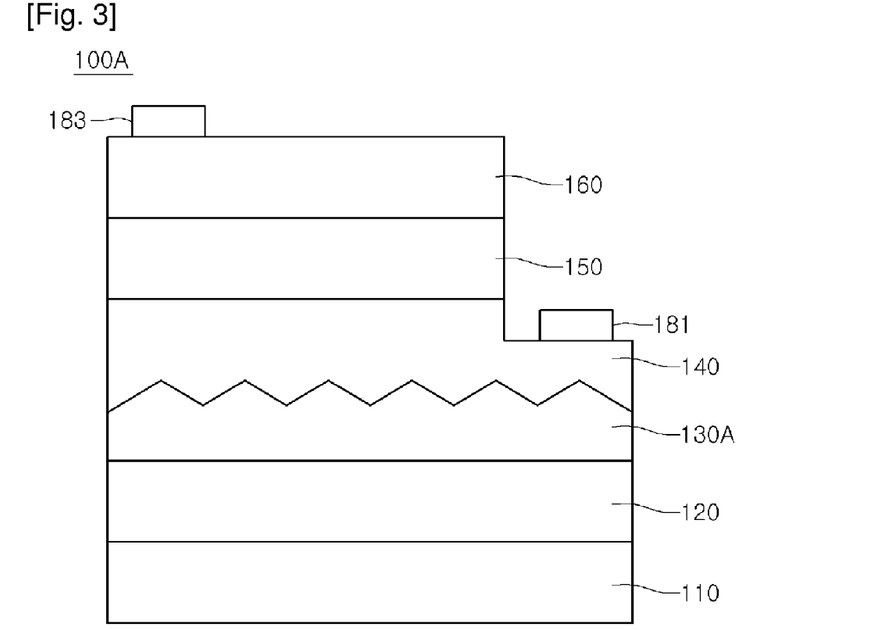
FIG. 3 is a side sectional view of a horizontal semiconductor light emitting device using FIG. 1.

FIG. 3 is a side sectional view of a horizontal semiconductor light emitting device using FIG. 1.

Referring to FIG. 3, in a horizontal semiconductor light emitting device 100A, the first conductive semiconductor layer 140 is exposed through a mesa etching process. A first electrode 181 is formed on a portion of the first conductive semiconductor layer 140 and a second electrode 183 is formed on the second conductive semiconductor layer 160.

Figure 4:
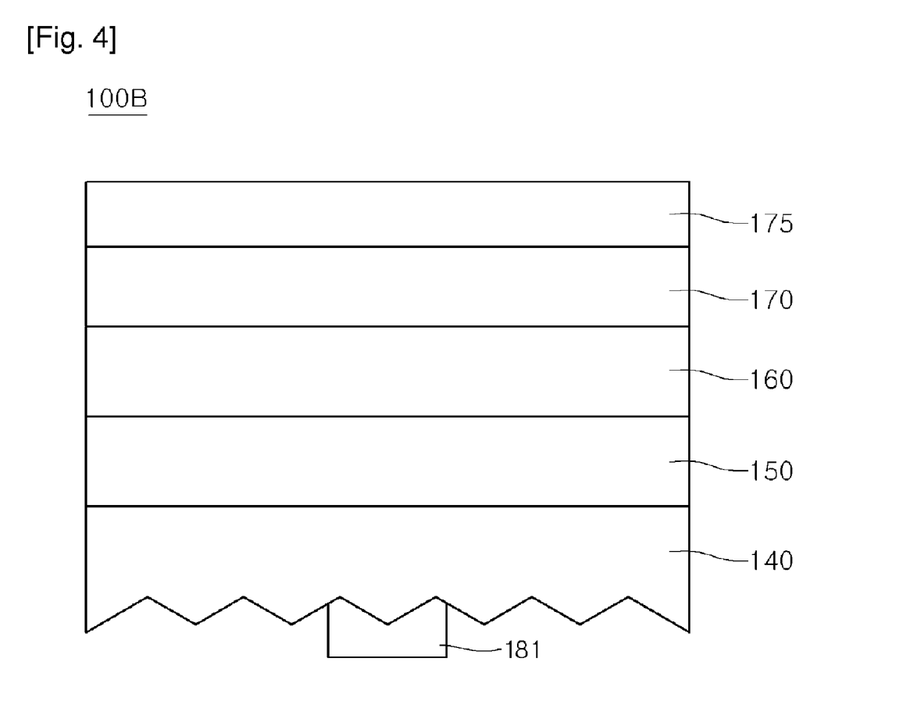
FIG. 4 is a side sectional view of a vertical semiconductor light emitting device using FIG. 1.

FIG. 4 is a side sectional view of a vertical semiconductor light emitting device using FIG. 1.

Referring to FIG. 4, in a vertical semiconductor light emitting device 100B, a reflective electrode layer 170 is formed on the second conductive semiconductor layer 160 and a conductive supporting substrate 175 is formed on the reflective electrode layer 170. The substrate 110 of FIG. 1 is removed through a physical or/and chemical process. A laser lift off (LLO) process that can remove the substrate 110 by irradiating laser having a predetermined wavelength to the substrate 110 may be used as the physical process. In the chemical process, wet etching solution is injected to the buffer layer 120 or/and the first undoped semiconductor layer 130A between the substrate 110 and the first conductive semiconductor layer 140 to remove the buffer layer 120 or/and the first undoped semiconductor layer 130A and thus the substrate 110 is removed.

A first electrode 181 may be formed under the first conductive semiconductor layer 140. Here, an undersurface of the first conductive semiconductor layer 140 may be uneven to correspond to the uneven surface of the first undoped semiconductor layer 130A.

FIGS. 5 to 8 illustrates a second embodiment.

Figure 5:
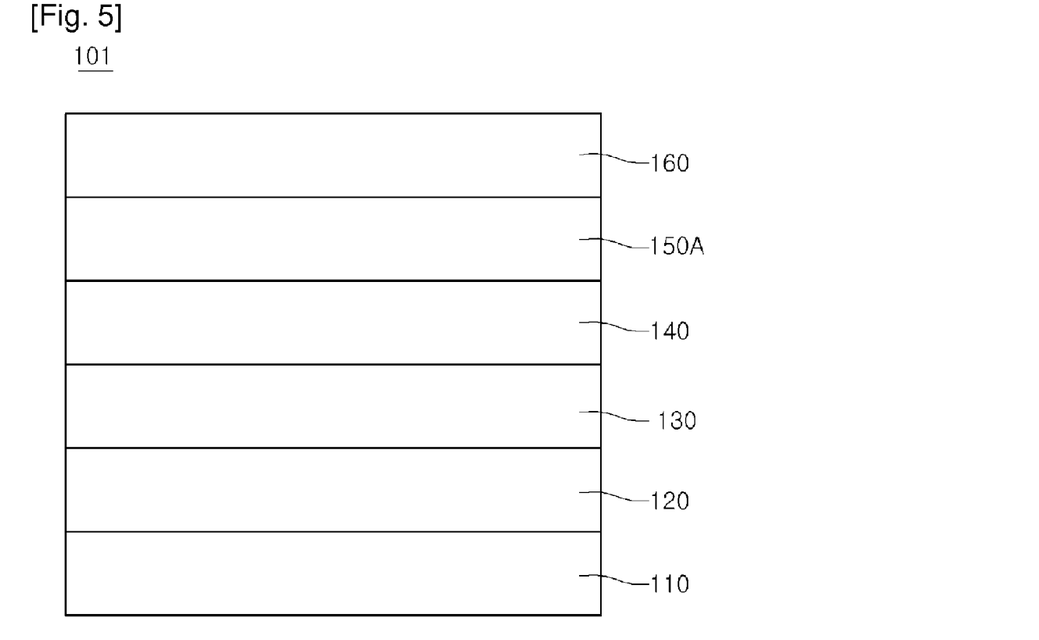
FIG. 5 is a side sectional view of a semiconductor light emitting device according to a second embodiment.
Figure 6:
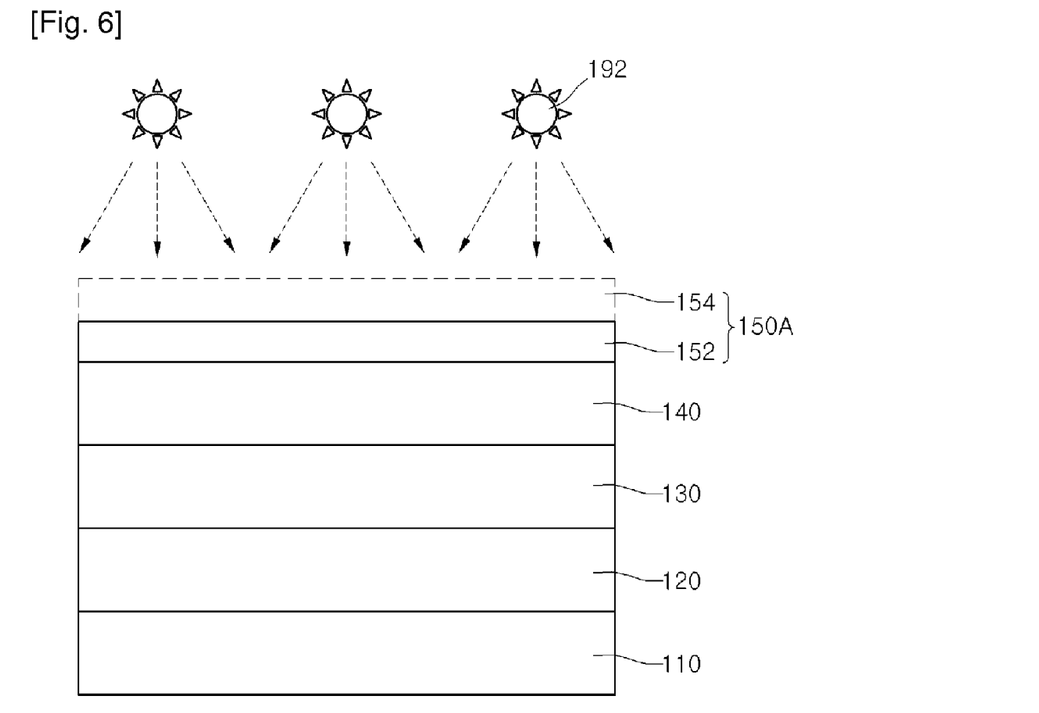
FIG. 6 is a view of a forming example of a quantum well layer of an active layer of FIG. 5.

FIG. 5 is a side sectional view of a semiconductor light emitting device according to a second embodiment, and FIG. 6 is a view of a forming example of a quantum well layer of an active layer of FIG. 5. In the first and second embodiments, like reference numbers will be used to refer to like parts. The same parts as those of the first embodiment will not be described in this embodiment.

Referring to FIGS. 5 and 6, a semiconductor light emitting device 101 comprises an active layer 150A exposed to light from lamps 192. The active layer 150A comprises a single quantum well structure or a multi-quantum well structure. The first undoped semiconductor layer 130 or/and the buffer layer 120 of the first embodiment may be not formed.

By supplying carrier gases such as nitrogen gas or/and hydrogen gas and atmospheric gases such as $NH_3$, TMGa (or TEGa), TMIn at a predetermined growing temperature, an $In_xGa_{1-x}N$ ($0<x\leq1$) quantum well layer 152 and a quantum barrier layer 154 are grown to form the active layer 150A. The quantum well layer 152 may be formed of InGaN and the quantum barrier layer 154 may be formed of GaN or AlGaN.

When the quantum well layer 152 is grown, a large amount of Ga vacancies are generated. The Ga vacancies have negative charges to trap positrons.

The quantum well layer 152 is grown in-situ through an exposure process using the lamps 192. An photo enhanced minority holes are generated in the quantum well layer 152 and trapped in the vacancies. Therefore, the quantum well layer 152 effectively prevents the generation of the Ga vacancies in the InGaN having the negative charges. That is, the Ga vacancies are neutralized by the photo enhanced minority holes generated in the InGaN of the quantum well layer 152 and thus the trapping of the positrons in the Ga vacancies is prevented, contributing to the emission of the light.

Since an amount of the free positrons of the active layer 150A may be increased, non-radiative recombination is reduced, thereby increasing the light emitting efficiency.

Figure 7:
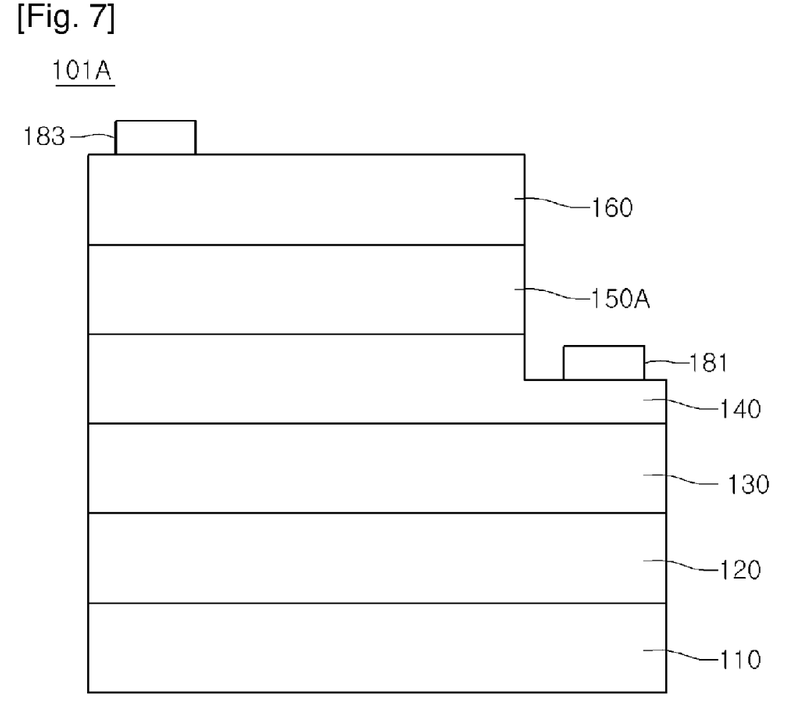
FIG. 7 is a side sectional view of a horizontal semiconductor light emitting device using FIG. 5.

FIG. 7 is a side sectional view of a horizontal semiconductor light emitting device using FIG. 5.

Referring to FIG. 7, in a horizontal semiconductor light emitting device 101A, a first electrode 181 is formed on the first conductive semiconductor layer 140 and a second electrode 183 is formed on the second conductive semiconductor layer 160. When a forward current is applied to the first and second electrodes 181 and 183, the active layer 150A emits light by the combination of the electrons and holes. At this point, since the Ga vacancies are reduced in the active layer 150A, the free positrons increase, thereby improving the light emitting efficiency.

Figure 8:
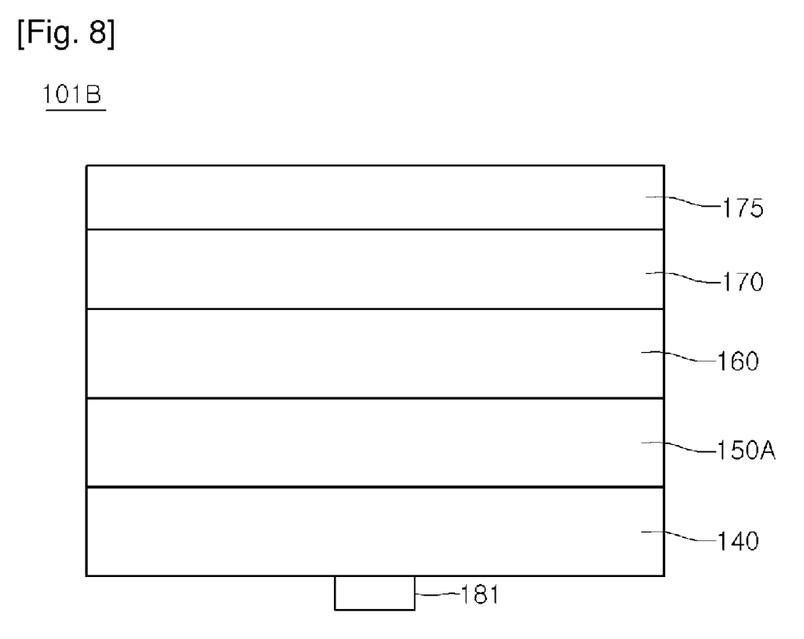
FIG. 8 is a side sectional view of a vertical semiconductor light emitting device using FIG. 5.

FIG. 8 is a side sectional view of a vertical semiconductor light emitting device using FIG. 5.

Referring to FIG. 8, in a vertical semiconductor light emitting device 101B, a reflective electrode layer 170 and a conductive supporting substrate 175 are formed on a second conductive semiconductor layer 160. The first undoped semiconductor layer 130, buffer layer 120, and substrate 110 that are shown in FIG. 5 and disposed under the first conductive semiconductor layer 140 are removed and the first electrode 181 is formed under the first conductive semiconductor layer 140. The free positrons of the active layer 150A increase and thus the light emitting efficiency can be improved.

FIGS. 9 to 13 illustrate a third embodiment.

Figure 9:
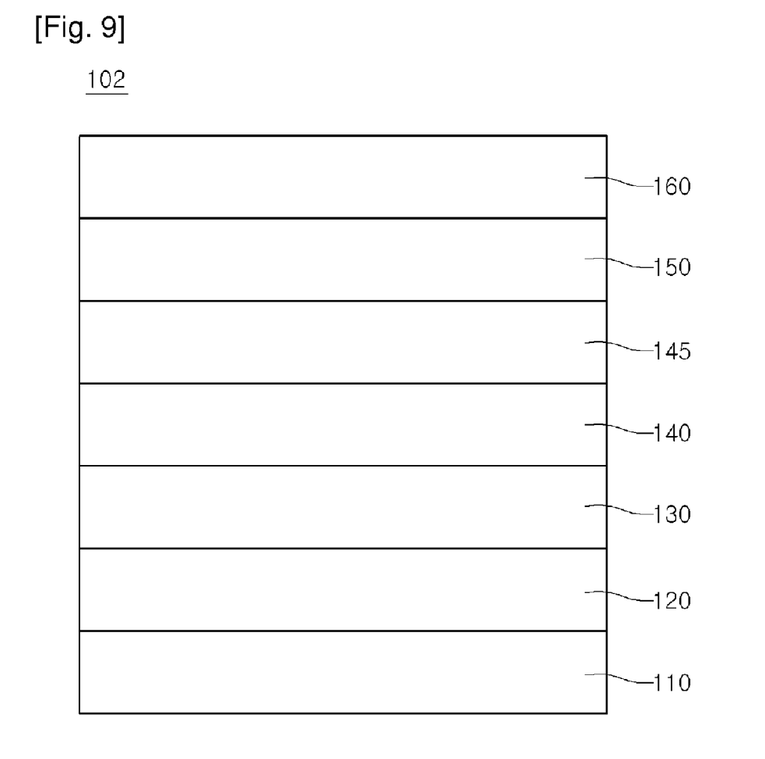
FIG. 9 is a side sectional view of a semiconductor light emitting device according to a third embodiment.
Figure 10:
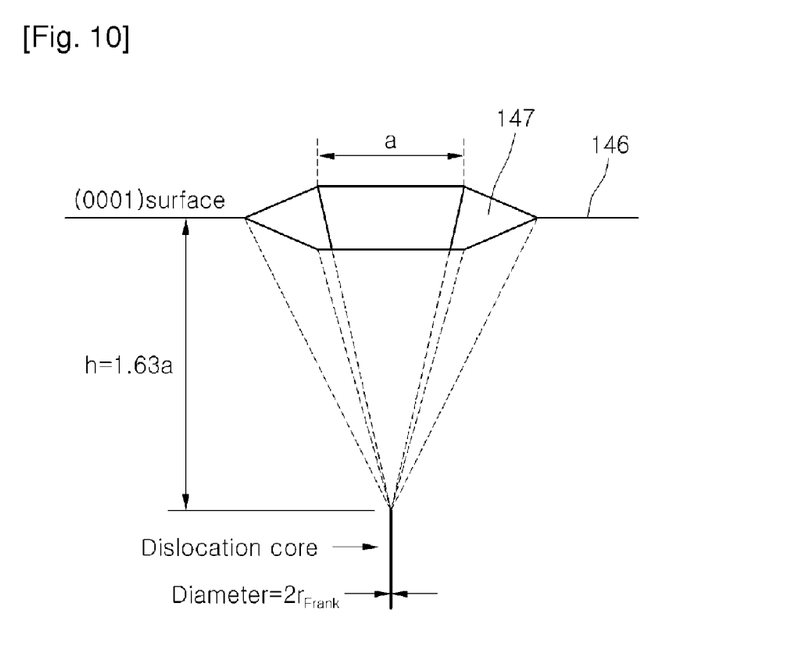
FIG. 10 is a view of an example of a V-defect of a low-mol InGaN layer in FIG. 9.
Figure 11:
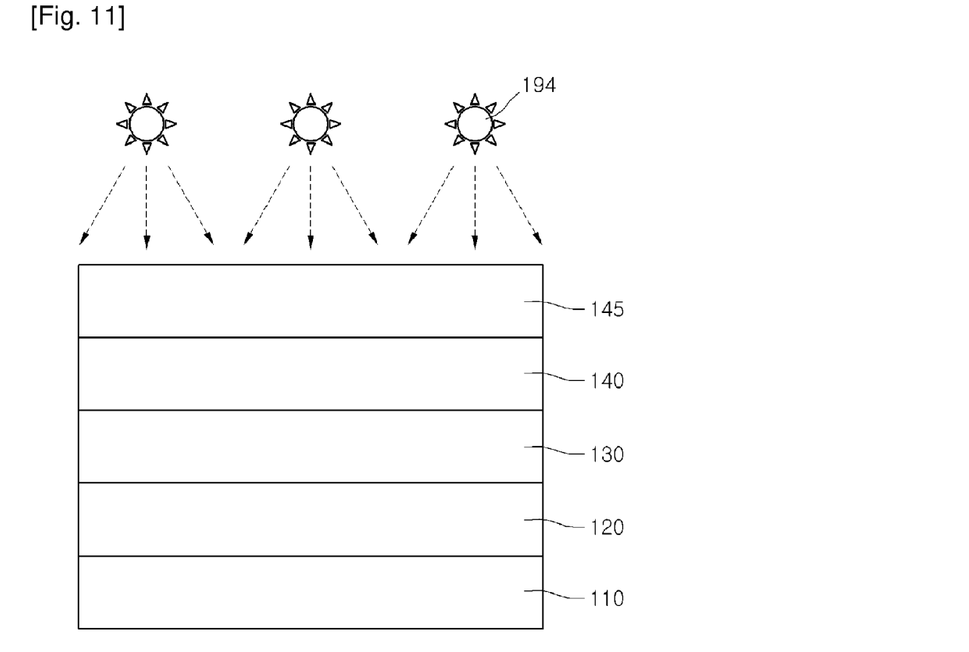
FIG. 11 is a view of a forming example of a low-mol InGaN layer of FIG. 9.

FIG. 9 is a side sectional view of a semiconductor light emitting device according to a third embodiment, FIG. 10 is a view of an example of a V-defect of a low-mol InGaN layer in FIG. 9, and FIG. 11 is a view of a forming example of a low-mol InGaN layer of FIG. 9. In the first and third embodiments, like reference numbers will be used to refer to like parts. The same parts as those of the first embodiment will not be described in this embodiment.

Referring to FIG. 9, a semiconductor light emitting device 102 comprises a low-mol InGaN layer 145 having a small amount of indium. The low-mol InGaN layer 145 is formed between the first conductive semiconductor layer 140 and the active layer 150 and increases internal quantum efficiency of the active layer 150.

The low-mol InGaN layer 145 may be grown to an InGaN spreading layer having a small amount of indium or an InGaN barrier layer to control a strain of the active layer 150. Here, in the growing of the low-mol InGaN layer 118, an amount of the indium doped may be less than 5% of an amount of the InGaN.

In the semiconductor light emitting device 102, the first undoped semiconductor layer 130 or/and the buffer layer 120 between the first conductive semiconductor layer 140 and the substrate 110 may be omitted.

Referring to FIG. 10, when the indium is incorporated in the low-mol InGaN layer 145, the indium atoms are located on a (10$\bar{1}$1) facet rather than a (0001) facet. Therefore, when the low-mol InGaN layer 145 contains the indium, a large amount of V-defect 147 may be generated. A surface 146 of the layer containing the indium has a predetermined surface energy E. When the V-defect 147 is generated, the surface energy E is altered to a surface energy E'

The surface energy E' can be expressed as follows:

$$E' = f(S, \lambda x)$$

Where, S is an energy that is generated as the (0001) facet is disappeared and the (10$\bar{1}$1) facet is generated, and $\lambda x$ is electric potential core energy. The V-defect 147 is continuously generated and increased until the surface 146 of the low-mol InGaN layer 145 has a minimum E' value. In addition, since the InGaN layer 145 is doped with the indium, the (10$\bar{1}$1) facet is primarily grown than the (0001) facet 146 by the potential energy different (e.g., 1.5-2V).

In order to prevent this, as shown in FIG. 11, the low-mol InGaN layer 145 is exposed to the light from the lamps 194 in-situ. At this point, when the low-mol InGaN layer 145 is grown, the generation and growing of the V-defect 147 by the indium doping is suppressed and thus the high quality InGaN layer can be grown.

That is, when the low-mol InGaN layer 145 is exposed to the light from the lamps 194 during being grown, an photo enhanced minority holes are generated in the crystal of the low-mol InGaN layer 145. The photo enhanced minority holes disturb a surface electric state of the (10$\bar{1}$1) facet to suppress the generation and growing of the V-defect 147 caused by the indium. That is, the generated photo enhanced minority holes disturb a potential energy for the (10$\bar{1}$1) facet of the V-defect 147 in the low-mol InGaN layer 145 to disturb the indium that intends to keep adhering to the V-defect 147, thereby suppressing the growing of the V-defect 147.

Since the low-mol InGaN layer 145 is grown by exposure process using the lamps 194, the generation and growing of the V-defect 147 generated by the doping of the indium is suppressed, thereby growing a high quality InGaN layer 145. In addition, the active layer 150 grown on the low-mol InGaN layer 145 is improved in its light emitting efficiency and the diode property such as the inverse current and inverse voltage of the resulting LED structure is improved, thereby enhancing the electrical tolerance of the ESD and the like.

Figure 12:
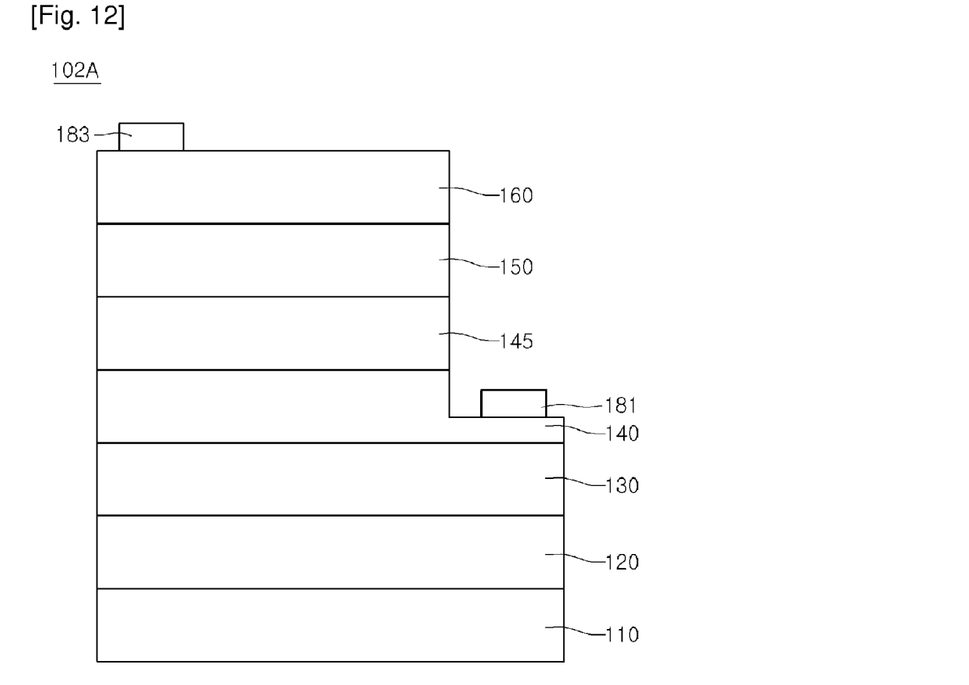
FIG. 12 is a side sectional view of a horizontal semiconductor light emitting device using FIG. 9.

FIG. 12 is a side sectional view of a horizontal semiconductor light emitting device using FIG. 9.

Referring to FIG. 12, a horizontal semiconductor light emitting device 102A comprises a first conductive semiconductor layer 140, a low-mol InGaN layer 145, an active layer 150, and a second conductive semiconductor layer 160. When the first conductive semiconductor layer 140 is exposed by a mesa etching process, the first electrode 181 is formed on the first conductive semiconductor layer 140 and the second electrode 183 is formed on the second conductive semiconductor layer 160.

Figure 13:
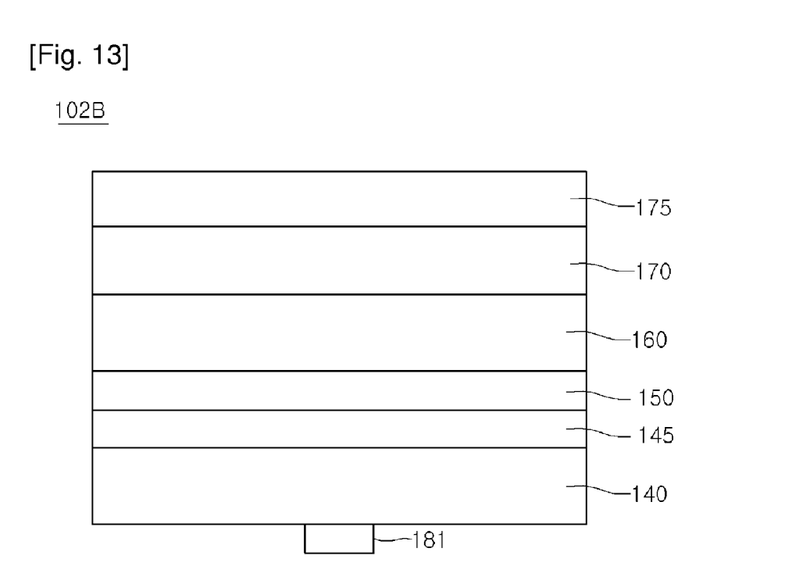
FIG. 13 is a side sectional view of a vertical semiconductor light emitting device using FIG. 9.

FIG. 13 is a side sectional view of a vertical semiconductor light emitting device using FIG. 9.

Referring to FIG. 13, in a vertical semiconductor light emitting device 102B, the first electrode 181 is formed under the first conductive semiconductor layer 140 and the low-mol InGaN layer 145, active layer 150, second conductive semiconductor layer 160, reflective electrode layer 170, and conductive supporting substrate 175 are sequentially formed on the first conductive semiconductor layer 140.

In this third embodiment, when the low-mol InGaN layer 145 having a small amount of indium is formed under the active layer 150, the low-mol InGaN layer 145 is exposed to the light from the lamps 194 (see FIG. 11) to suppress the generation and growing of the V-defect caused when the indium is doped, thereby improving the light emitting efficiency of the active layer 150.

Figure 14:
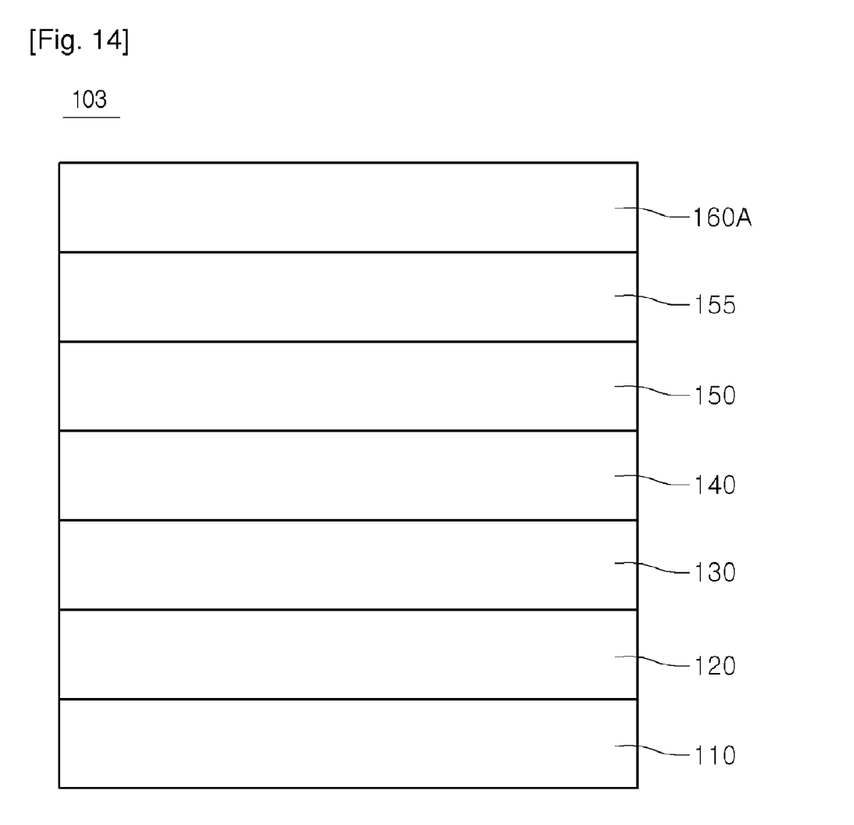
FIG. 14 is a side sectional view of a semiconductor light emitting device according to a fourth embodiment.
Figure 15:
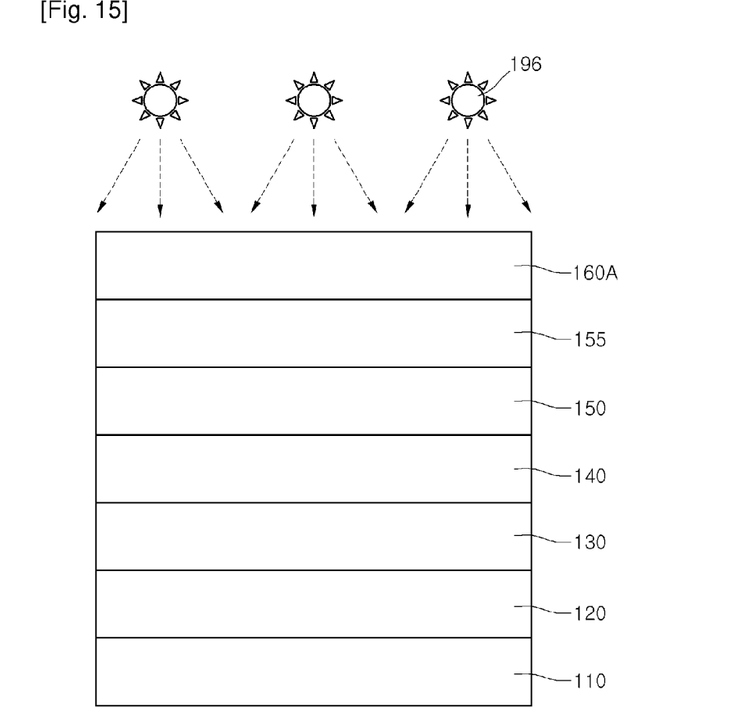
FIG. 15 is a view of a lamp exposure example of a second conductive semiconductor layer of FIG. 14.

FIGS. 14 to 17 illustrate a fourth embodiment. FIG. 14 is a side sectional view of a semiconductor light emitting device according to a fourth embodiment, and FIG. 15 is a view of a lamp exposure example of a second conductive semiconductor layer of FIG. 14. In the first and fourth embodiments, like reference numbers will be used to refer to like parts. The same parts as those of the first embodiment will not be described in this embodiment.

Referring to FIGS. 14 and 15, a semiconductor light emitting device 103 comprises a substrate 110, a buffer layer 120, a first undoped semiconductor layer 130, a first conductive semiconductor layer 140, an active layer 150, a second undoped semiconductor layer 155, and a second conductive semiconductor layer 160A.

The first undoped semiconductor layer 130 is an undoped GaN layer, which may be exposed to light from the lamp. At least one of the buffer layer 120 and the first undoped semiconductor layer 130 may be omitted.

The second undoped semiconductor layer 155 is grown on the active layer 150 and the second conductive semiconductor layer 160A is grown on the second undoped semiconductor layer 155. Here, the second undoped semiconductor layer 155 may be an undoped GaN layer. A third undoped GaN layer may be formed on the second conductive semiconductor layer 160A.

The second conductive semiconductor layer 160A is formed on the second undoped semiconductor layer 155. At this point, the second conductive semiconductor layer 160A is a P-type semiconductor layer, i.e., a P-type GaN layer, which is formed by supplying carrier gas such as hydrogen gas, and TMGa, (EtCp$_2$Mg){Mg(C$_2$H$_5$C$_5$H$_4$)$_2$}, and NH3 at a predetermined growing temperature. Here, a thickness of the second undoped semiconductor layer 155 is 10-500 Å and a thickness of the second conductive semiconductor layer 160A is 10-2000 Å.

The second conductive semiconductor layer 160A is grown as a thin film. Since the P-type dopants doped in the second conductive semiconductor layer 160A are naturally diffused to the second undoped semiconductor layer 155, the second conductive semiconductor layer 160A may be formed as the high quality semiconductor layer. Here, the P-type dopants may be Mg but not be limited to this.

Since the second conductive semiconductor layer 160A is grown in-situ through an exposure process using the lamps 196, the photo enhanced minority holes are generated in the second undoped semiconductor layer 155 and thus the combination between the photo enhanced minority holes and the H-ions may be induced. That is, the photo enhanced minority holes disturbs the Mg—H bond to improve the concentration of the hole-carrier.

That is, when the second conductive semiconductor layer 160A is doped with Mg, the Mg is bonded to H of NH$_3$ to form Mg—H bond having an electrical insulation property. Therefore, it is difficult to attain a high concentration second conductive semiconductor layer 160A. However, when the second conductive semiconductor layer 160A is grown in-situ through the exposure process using the lamps 196, the photo enhanced minority electrons are generated and the generated photo enhanced minority electrons are bonded to the Mg. Accordingly, the bonding of the Mg to the H-ions that are used as atmospheric gas and carrier gas is prevented and thus the deterioration of the Hole-carrier concentration of the second conductive semiconductor layer 160 can be prevented.

In addition, by generating the photo enhanced minority electrons using the lamp 196 when the second conductive semiconductor layer 160 is grown, the primary bond between the generated photo enhanced minority electrons and the Mg-ions are generated to prevent the Mg—H bond and increases the hole concentration through a heat treatment at a high temperature for a short time to the exclusion of the $HN_3$ and $H_2$ gases. Therefore, the damage of the active layer 150 is reduced, thereby improving the light emitting efficiency.

Figure 16:
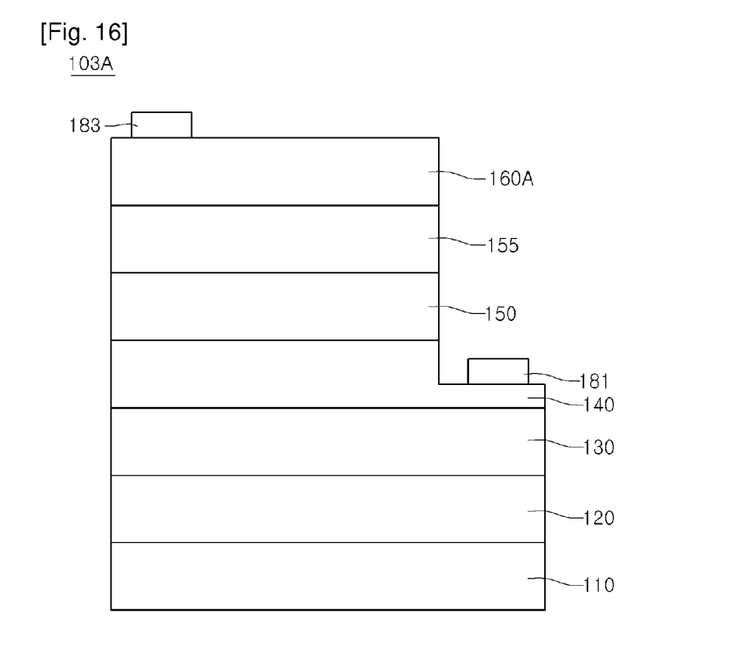
FIG. 16 is a side sectional view of a horizontal semiconductor light emitting device using FIG. 14.

FIG. 16 is a side sectional view of a horizontal semiconductor light emitting device using FIG. 14.

Referring to FIG. 16, a horizontal semiconductor light emitting device 103A comprises a first conductive semiconductor layer 140, an active layer 150, a second undoped semiconductor layer 155, and a second conductive semiconductor layer 160A. When the first conductive semiconductor layer 140 is exposed through a mesa etching process, a first electrode 181 is formed on the first conductive semiconductor layer 140 and a second electrode 183 is formed on the second conductive semiconductor layer 160A.

Figure 17:
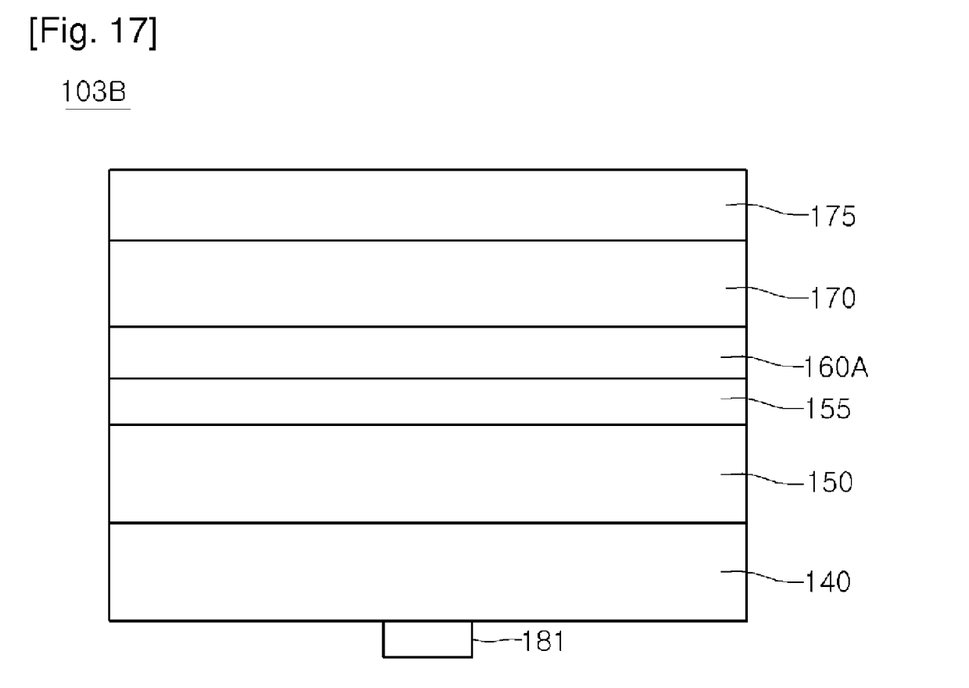
FIG. 17 is a side sectional view of a vertical semiconductor light emitting device using FIG. 14.

FIG. 17 is a side sectional view of a vertical semiconductor light emitting device using FIG. 14.

Referring to FIG. 17, in a vertical semiconductor light emitting device 103B, a first electrode 181 is formed under a first conductive semiconductor layer 140, and an active layer 150, a second undoped semiconductor layer 155, a second conductive semiconductor layer 160A, a reflective electrode layer 170, and a conductive supporting substrate 175 are sequentially formed on the first conductive semiconductor layer 140.

In the fourth embodiment, when the second undoped semiconductor layer 155 and the second conductive semiconductor layer 160A are grown on the active layer 150, the second conductive semiconductor layer 160A is exposed to light from the lamps to form an photo enhanced minority electrons. Therefore, the Mg—H bond is prevented in the second conductive semiconductor layer 160A and the hole concentration can be improved. In addition, since an amount of P-type dopants can be reduced and thus the damage of the active layer 150 can be reduced.

Meanwhile, when growing the semiconductor light emitting devices 100, 101, 102, and 103 in accordance with the first to fourth embodiments, at least one of the semiconductor layers is grown in-situ through an exposure process using lamps. At this point, the semiconductor layer exposed to the light from the lamps generates an photo enhanced minority carriers such as electrons and holes through a chemical reaction with materials implanted during the growing process. Therefore, the light emitting efficiency or electrical tolerance can be enhanced.

Here, the lamps disclosed in the embodiments are lamps for performing the photo electro luminescence growing. For example, the lamps may be mercury lamps, X-ray lamps, E-beam lamps, and halogen lamps, and combination thereof. However, the lamps are not limited to these. In addition, different or same lamps may be used for different semiconductor layers.

Further, features of each embodiment may be applied to other embodiments. That is, the features of the embodiments are not limited to the above description. For example, the first undoped semiconductor layer of the first embodiment, the active layer of the second embodiment, the low-mol InGaN layer of the third embodiment, and the second undoped semiconductor layer and the second conductive semiconductor layer of the fourth embodiment can be selectively applied to other embodiments.

In addition, the exposing time of the semiconductor layers to the light from the lamps may be proportional to, greater than, or less than the growing time of the corresponding semiconductor layers.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiments can improve light emission efficiency of an active layer.

The embodiments can improve a diode electrical property such as an inverse current, an inverse voltage, and the light of a semiconductor light emitting device.

The embodiments can enhance an electrical tolerance such as ESD.

The Embodiments can provide a first conductive semiconductor layer that has an excellent crystalline.

The invention claimed is:

1. A semiconductor light emitting device comprising:
a first undoped semiconductor layer including an uneven top surface;
a first conductive semiconductor layer;
an active layer formed on the first conductive semiconductor layer; and
a second conductive semiconductor layer formed on the active layer,
wherein the first undoped semiconductor layer includes first portions having a plurality of dislocations being spaced apart from each other and second portions not including the first portions, and
a top part of the first portions protrudes relative to a top part of the second portions.

2. The semiconductor light emitting device as claimed in claim 1, further comprising a buffer layer under the first undoped semiconductor layer and a substrate under the buffer layer.

3. The semiconductor light emitting device in claim 1, further comprising a second undoped semiconductor layer between the active layer and the second conductive semiconductor layer, wherein the second undoped semiconductor layer has a p-type dopant.

4. The semiconductor light emitting device in claim 3, further comprising a third undoped semiconductor layer on the second conductive semiconductor layer.

5. The semiconductor light emitting device in claim 3, wherein a thickness of the first undoped semiconductor layer is about 1 µm to 5 µm.

6. The semiconductor light emitting device in claim 3, wherein the second undoped semiconductor layer has a thickness that is thinner than a thickness of the first undoped semiconductor layer.

7. The semiconductor light emitting device in claim 3, wherein a thickness of the second undoped semiconductor layer is about 10 Å to 500 Å.

8. The semiconductor light emitting device in claim 1, wherein a lower surface of the first conductive semiconductor layer has an uneven surface.

9. The semiconductor light emitting device in claim 1, wherein a thickness of the second conductive semiconductor layer is about 10 Å to 2000 Å.

10. The semiconductor light emitting device in claim 1, wherein the first undoped semiconductor layer is formed of a GaN based layer.

11. The semiconductor light emitting device in claim 1, wherein a thickness of at least one of the first portions in the first undoped semiconductor layer is thicker than a thickness of an area in the first undoped semiconductor layer where no dislocation exists.

12. A method of fabricating a semiconductor light emitting device, the method comprising:

forming a first undoped semiconductor layer;

forming a first conductive semiconductor layer on the first undoped semiconductor layer;

forming an active layer on the first conductive semiconductor layer; and forming a second semiconductor layer on the active layer, wherein a top surface of the first undoped semiconductor layer is formed of an uneven surface, the first undoped semiconductor layer includes first portions having a plurality of dislocations being spaced apart from each other and second portions not including the first portions, and a top part of the first portions protrudes relative to a top part of the second portions.

13. The method as claimed in claim 12, wherein at least one of the layers is exposed to a lamp when the layer is grown, and the lamp includes at least one of an Hg lamp, X-ray, an electron beam and a halogen lamp.

14. The method as claimed in claim 13, wherein the first undoped semiconductor layer is exposed to the lamp when the first undoped semiconductor layer is grown.

* * * * *